United States Patent
Tsai

(10) Patent No.: US 7,129,111 B2
(45) Date of Patent: Oct. 31, 2006

(54) METHOD FOR FORMING BUMP PROTECTIVE COLLARS ON A BUMPED WAFER

(75) Inventor: Chi-Long Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/895,060

(22) Filed: Jul. 21, 2004

(65) Prior Publication Data

US 2005/0020051 A1    Jan. 27, 2005

(30) Foreign Application Priority Data

Jul. 21, 2003   (TW) ............................... 92119879 A

(51) Int. Cl.
*H01L 21/44*   (2006.01)
*H01L 21/50*   (2006.01)
*H01L 21/48*   (2006.01)

(52) U.S. Cl. ................ 438/106; 438/613; 257/E27.161

(58) Field of Classification Search ................ 438/613, 438/612, 106, 107, 108, 113
See application file for complete search history.

(56) References Cited

U.S. PATENT DOCUMENTS

| | | | | |
|---|---|---|---|---|
| 5,872,051 A | * | 2/1999 | Fallon et al. | 438/616 |
| 6,165,885 A | * | 12/2000 | Gaynes et al. | 438/612 |
| 6,187,615 B1 | | 2/2001 | Kim et al. | 438/113 |
| 6,521,530 B1 | * | 2/2003 | Peters et al. | 438/667 |

* cited by examiner

*Primary Examiner*—David Nhu
(74) *Attorney, Agent, or Firm*—Troxell Law Office, PLLC

(57) ABSTRACT

A method of forming bump protective collars is disclosed. A wafer has an active surface with a plurality of bonding pads and a passivation layer. A plurality of reflowed bumps are formed over the bonding pads. A photoresist is coated on the active surface. Using the reflowed bumps as a photo mask, the photoresist is exposed and developed. After removing the photoresist, a plurality of bump protective collars are formed on the passivation layer and around the reflowed bumps for improving the reliability of the reflowed bumps.

8 Claims, 4 Drawing Sheets

US 7,129,111 B2

METHOD FOR FORMING BUMP PROTECTIVE COLLARS ON A BUMPED WAFER

FIELD OF THE INVENTION

The present invention relates to a bumping fabrication technology for integrated circuits, and more particularly, to a method for forming bump protective collars on a bumped wafer.

BACKGROUND OF THE INVENTION

Conventionally, the fabrication of wafer-level chip scale packages, WLCSP, is to form a plurality of bumps on a semiconductor wafer firstly, then the wafer is singulated to form a plurality of individual WLCSP including a chip, whereas, bumps are used as outer electrical terminals of the WLCSP (chip) to an exterior printed circuit board, PCB. However, during the IC operation, the chip will generate heat which will cause extra thermal stress on the bumps due to mismatching of thermal expansion coefficients between the chip and PCB. Thus, bumps will easily break or even fail. As revealed in U.S. Pat. No. 6,187,615, "chip scale packages and methods for manufacturing the chip scale packages at wafer level", a reinforcing layer is formed around the bumps to absorb the extra thermal stress on the bumps. The reinforcing layer is made of low-viscosity polymers which can be easily coated between the bumps before curing. After curing, the reinforcing layer will be able to protect the bumps from bump failure. However, during the coating process, bump surfaces for electrical connection can be coated with the reinforcing layer easily due to the characteristics of low-viscosity polymers and cause bad solder joint even electrical open between WLCSP and PCB after assembly.

SUMMARY OF THE INVENTION

A main purpose of the present invention is to provide a method for forming bump protective collars (BPC). A photoresist (PR) is coated on a bumped wafer. Then, by using the reflowed bumps on the wafer as a photo mask, the photoresist is exposed and developed to form a plurality of bump protective collars around the reflowed bumps to increase the reliability of the reflowed bumps.

A secondary purpose of the present invention is to provide a method for forming bump protective collars (BPC). A photoresist is coated on a wafer with a plurality of reflowed bumps. Then, by using the reflowed bumps as a photo mask, the coated photoresist is exposed and developed. The photoresist can be easily removed without residue remains on the upper spherical surfaces of the reflowed bumps. Thus, good electrical connection and solder joint between the chip and an exterior PCB can be achieved.

A third purpose of the present invention is to provide a device with bump protective collars. A passivation layer is formed on a surface of a substrate. The substrate has a plurality of reflowed (spherical) bumps. A plurality of bump protective collars are formed on the passivation layer and around the reflowed bumps. Preferably, the bump protective collars are lower than half of the height of the bumps. Thus, the reliability of the bumps can be increased with good electrical connection to an exterior PCB.

According to the present invention, a wafer is provided which has an active surface. The wafer has a plurality of bonding pads and a passivation layer on the active surface, the passivation layer covers the active surface and has a plurality of openings exposing the bonding pads. A plurality of reflowed bumps are formed over the bonding pads of the wafer. Preferably, the reflowed bumps are spherical in shape. Then a liquid photoresist is coated on the passivation layer. Using the reflowed bumps as a photo mask, the liquid photoresist is exposed and developed to form a plurality of bump protective collars around the corresponding reflowed bumps by removing the liquid photoresist.

DETAIL DESCRIPTION OF THE INVENTION

Please refer to the attached drawings, the present invention will be described by means of an embodiment below.

Figure 1A:
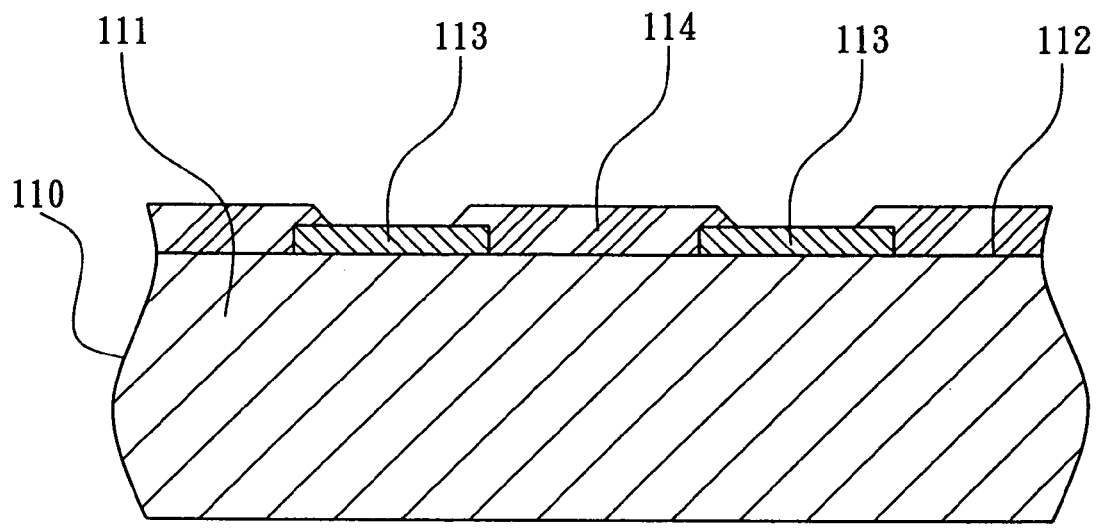
FIG. 1A to 1E are the cross-sectional views of a wafer during a process of bump protective collars according to the present invention.
Figure 1B:
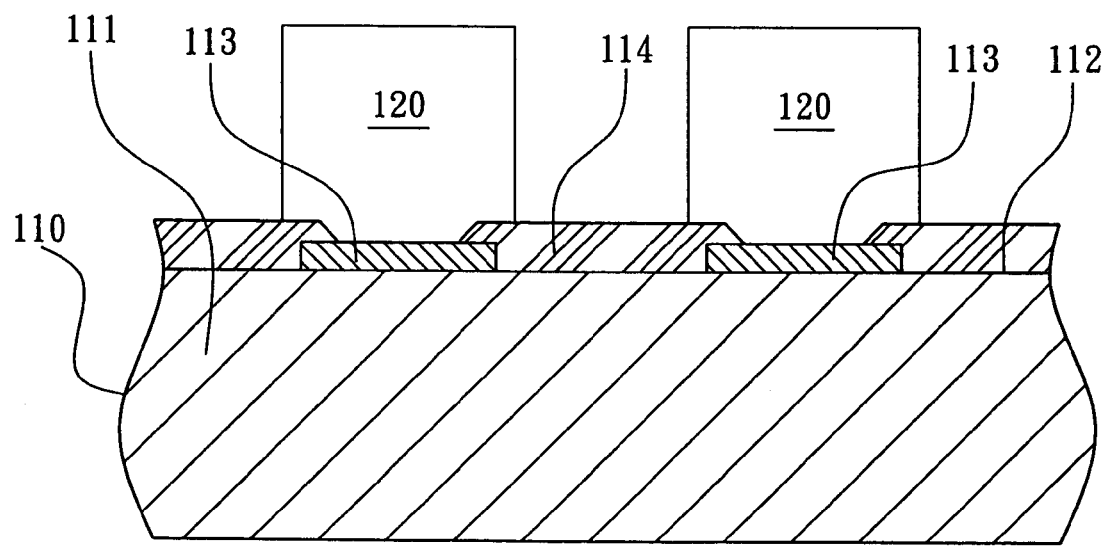
Figure 1C:
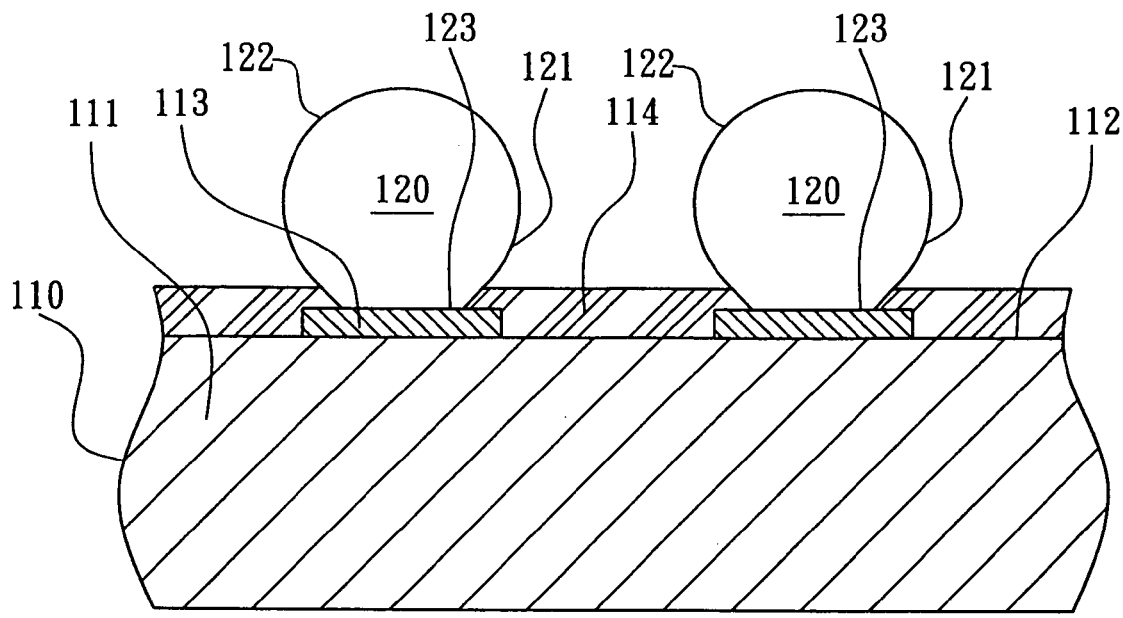
Figure 1D:
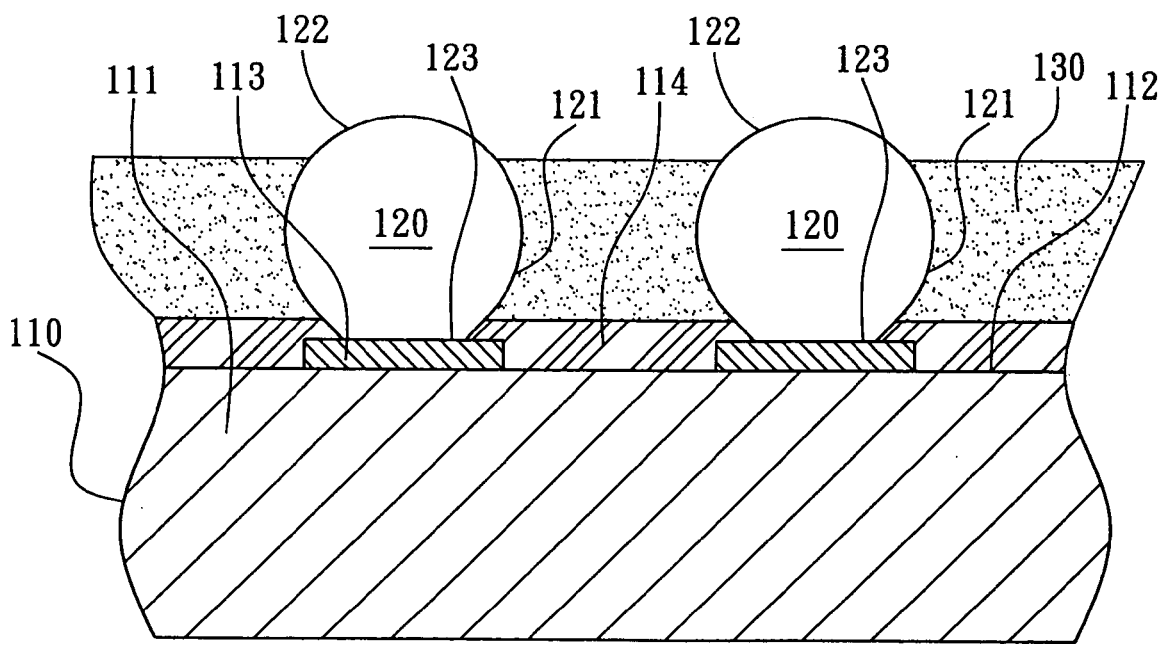
Figure 1E:
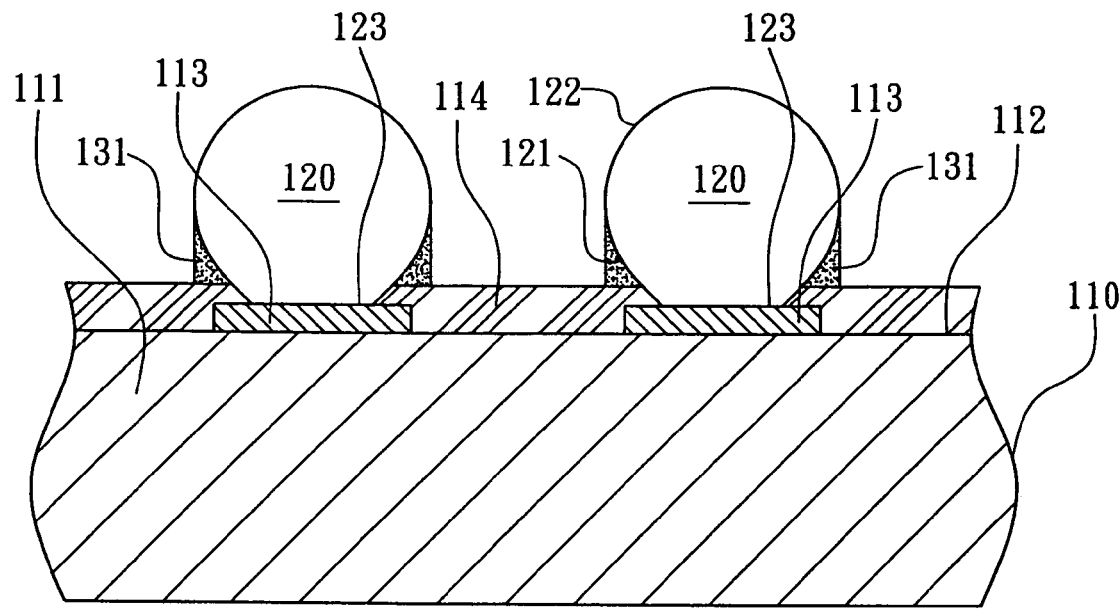

According to the first embodiment of the present invention, as shown in FIG. 1A, a wafer 110 or other substrate, such as silicon substrate or glass substrate, is provided. In this embodiment, the wafer 110 comprises a plurality of chips 111 and has an active surface 112. A plurality of bonding pads 113 and a passivation layer 114 are formed on the surface 112 of the wafer 110. The passivation layer 114 has a plurality of openings exposing the bonding pads 113. Preferably, an UBM layer (Under Bump Metallization) is formed over the bonding pads 113 (not shown in the figure). As shown in FIG. 1B, a plurality of solder pastes 120 are formed on the bonding pads 113 of the wafer 110 by plating or printing methods. The material of the solder pastes 120 may be 63/37 eutectic solder or 5/95 high lead solder, or lead-free solder. In this embodiment, the solder pastes 120 are made of 63/37 eutectic solder. As shown in FIG. 1C, after a reflow process, the solder pastes 120 are heated up 200° C. to 230° C. for 3 to 10 seconds, then cooled down to room temperature to make the solder pastes 120 transform a plurality of reflowed bumps 120. The reflowed bumps 120 are spherical or arc in shape. The reflowed bumps 120 are located over the bonding pads 113 so as to each have a bonding interface 123 on the corresponding bonding pads 113. The dimension of the bonding interface 123 should be smaller than the diameter of the reflowed bumps 120. The reflowed bump 120 has a lower spherical surface 121 and an upper spherical surface 122. As shown in FIG. 1D, a liquid photoresist 130 is coated on the passivation layer 114 of the wafer 110 by means of printing, spin coating, or dispensing. The photoresist 130 can be a positive type or a negative type photoresist. In this embodiment, the photoresist 130 is a positive type photoresist which can be a photo-sensitive resin such as polymide, PI, or benezocyclobutene, BCB. As shown in FIG. 1E, the reflowed bumps 120 are used as a photo mask for an exposure operation and then the photoresist 130 is exposed and developed. The photoresist 130 on the lower spherical surface 121 of the reflowed bumps 120 is sheltered by the reflowed bumps 120 and then can be remained during the developing process to removing the photoresist 130, therefore, a plurality of bump protective collars 131 are made from the photoresist 130 as photosensitive collars. The bump protective collars 131 are formed on the passivation layer 114 and around the reflowed bumps 120. The bump protective collars 131 are separately formed and connect the passivation layer 114 and the lower spherical surface 121 of the reflowed bumps 120 to provide excellent support to the reflowed bumps 120. Preferably, the bump protective collars 131 have a height lower than half of the height of the reflowed bumps 120.

The reflowed bumps 120 are bonded to the bonding pads 113, moreover, the lower spherical surfaces 121 of the reflowed bumps 120 are protected by the bump protective collars 131 connecting to the passivation layer 114. Therefore, the bonding strength between reflowed bumps 120 and the wafer 100 is enhanced and is capable of resisting extra thermal stress. Furthermore, the photoresist 130 which covered the upper spherical surface 122 of the reflowed bumps 120 during PR coating processes can be easily removed by exposure and development, therefore, no residue of photoresist 130 will remain on the upper spherical surface 122 of the reflowed bumps 120. The electrical connection of the reflowed bumps will not be effected. In this embodiment, the outer diameter of the bump protective collars 131 is less than the diameter of the reflowed bumps 120.

Figure 2:
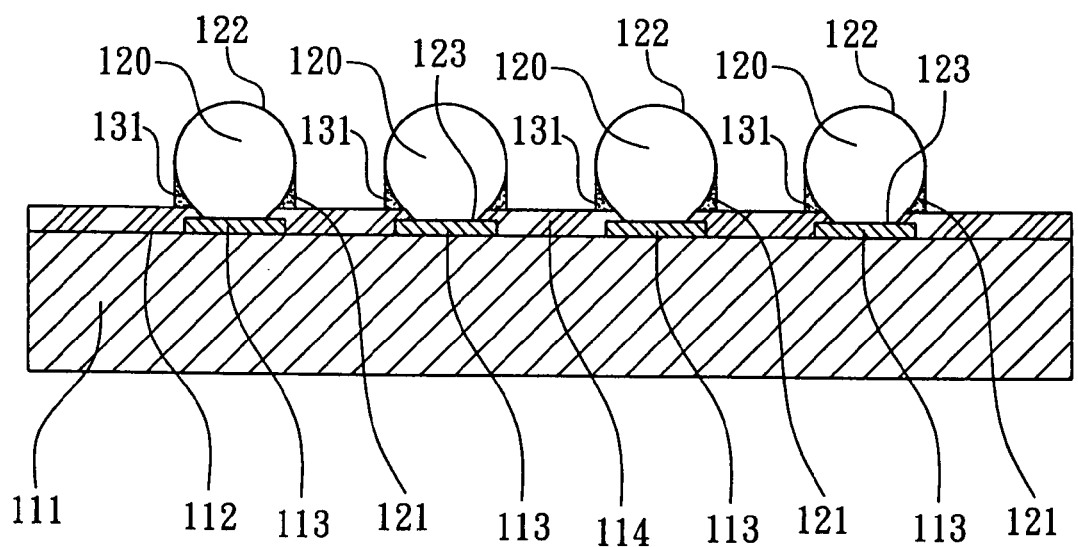
FIG. 2 is the cross-sectional view of a device with bump protective collars according to the present invention.
Figure 3:
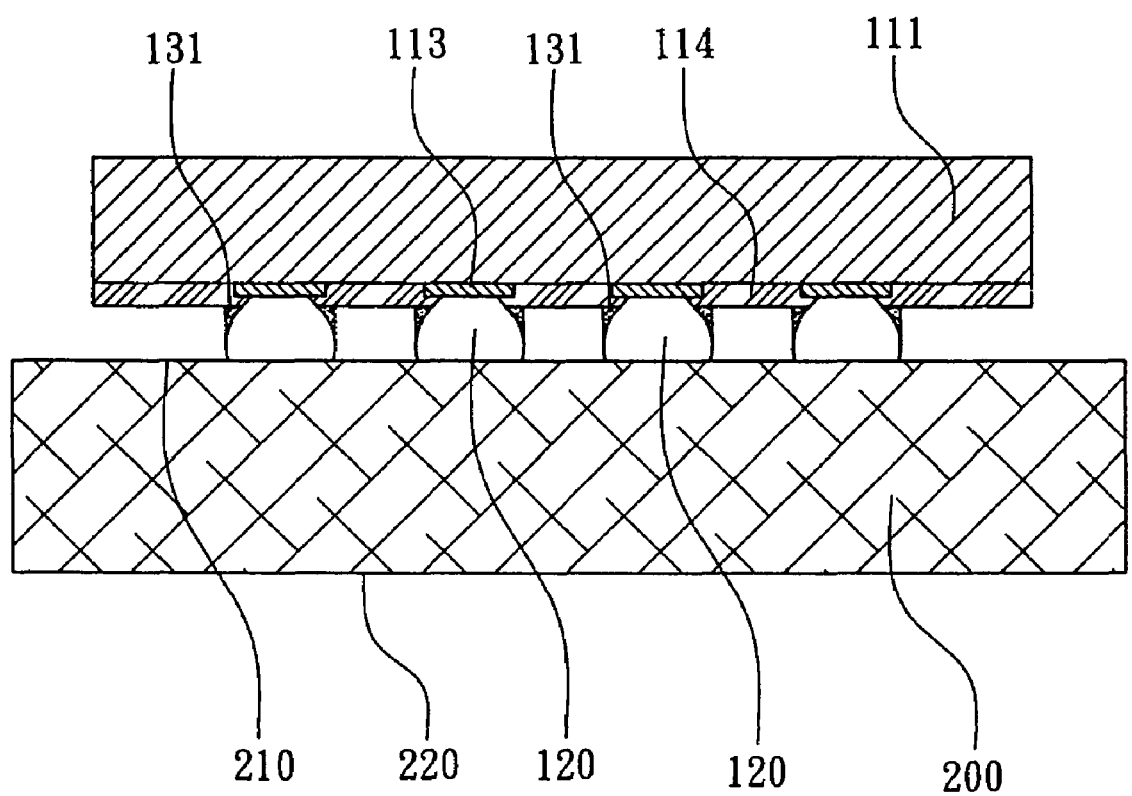
FIG. 3 is the cross-sectional view of the device after soldering with a PCB according to the present invention.

Furthermore, after forming the bump protective collars 131, as shown in FIG. 2, the wafer 110 with bump protective collars 131 is singulated to form a plurality of wafer-level chip scale packages (WLCSP) with bump protective collars 131. Each WLCSP comprises a chip 111, a plurality of reflowed bumps 120, and a plurality of bump protective collars 131 separately formed around the reflowed bumps 120. The chip 111 has a plurality of bonding pads 113 on its surface 112, and a passivation layer 114 covers the surface 112 and exposes the bonding pads 113 on the surface 112 of the chip 111. The reflowed bumps 120 are formed over the corresponding bonding pads 113 and the bump protective collars 131 separately formed around the reflowed bump 120. The bump protective collars 131 connect the lower surface 121 of the reflowed bumps 120 to the passivation layer 114 to enhance the support of the reflowed bumps 120 to resist extra thermal stress. As shown in FIG. 3, the WLCSP as shown in FIG. 2 is mounted to an exterior PCB 200 or substrate via flip chip technology to form a semiconductor module or package. The chip 111 is electrically connected to the upper surface 210 of the PCB 200 via the reflowed bumps 120. Since the reflowed bumps 120 are supportcted by the bump protective collars 131, therefore, the bonding strength of the reflowed bumps 120 are greatly enhanced. Conventionally, the reflowed bumps are placed on the lower surface 220 of the substrate 200. The reliability of the WLCSP with bump protective collars 131 fabricated by the present invention can be enhanced with good electrical connection due to the bump protective collars 131 formed on the lower spherical surface 121 of the reflowed bumps 120 without covering the upper spherical surface 122 of the reflowed bumps 120.

The above description of embodiments of this invention is intended to be illustrative and not limiting. Other embodiments of this invention will be obvious to those skilled in the art in view of the above disclosure.

What is claimed is:

1. A method for forming a plurality of bump protective collars comprising:
    providing a wafer having a surface, the wafer having a plurality of bonding pads and a passivation layer on the surface, the passivation layer covering the surface and having a plurality of openings exposing the bonding pads;
    forming a plurality of reflowed bumps over the bonding pads of the wafer;
    coating a liquid photoresist on the passivation layer; and
    patterning the liquid photoresist to form the bump protective collars made of residual of the liquid photoresist, the bump protective collars formed on the passivation layer around the reflowed bumps.

2. The method of claim 1, wherein the step of patterning the liquid photoresist comprises exposing and developing the liquid photoresist using the reflowed bumps as a photo mask.

3. The method of claim 1, wherein the photoresist is a positive photoresist.

4. The method of claim 1, wherein an outer diameter of each bump protective collar is less than the diameter of the corresponding reflowed bump.

5. The method of claim 1, wherein the reflowed bumps are spherical in shape.

6. The method of claim 1, wherein the reflowed bumps comprise bonding interfaces on the bonding pads, a diameter of the bonding interfaces being smaller than a diameter of the reflowed bumps.

7. The method of claim 1, wherein the step of forming the reflowed bumps comprises forming a plurality of solder pastes on the bonding pads of the wafer by plating or printing method and then reflowing the solder pastes to form the reflowed bumps.

8. The method of claim 1, wherein a material of the bump protective collars is selected from polyimide (PI) or Benezocyclobutene (BCB).

* * * * *